US010089427B2

(12) United States Patent
Bjesse

(10) Patent No.: US 10,089,427 B2
(45) Date of Patent: Oct. 2, 2018

(54) METHOD AND APPARATUS FOR WORD-LEVEL NETLIST PREPROCESSING AND ANALYSIS USING SAME

(71) Applicant: SYNOPSYS, INC., Mountain View, CA (US)

(72) Inventor: Per M. Bjesse, Portland, OR (US)

(73) Assignee: SYNOPSYS, INC., Mountain View, CA (US)

( * ) Notice: Subject to any disclaimer, the term of this patent is extended or adjusted under 35 U.S.C. 154(b) by 77 days.

(21) Appl. No.: 15/270,958

(22) Filed: Sep. 20, 2016

(65) Prior Publication Data

US 2017/0011140 A1 Jan. 12, 2017

Related U.S. Application Data

(63) Continuation of application No. 12/236,646, filed on Sep. 24, 2008, now Pat. No. 9,489,477.

(51) Int. Cl.
*G06F 17/50* (2006.01)

(52) U.S. Cl.
CPC ........ *G06F 17/505* (2013.01); *G06F 17/5022* (2013.01); *G06F 17/5081* (2013.01)

(58) Field of Classification Search
USPC ....................................................... 716/103
See application file for complete search history.

(56) References Cited

U.S. PATENT DOCUMENTS

| | | |
|---|---|---|
| 6,505,328 B1 | 1/2003 | Van Ginneken et al. |
| 6,574,787 B1 | 6/2003 | Anderson |
| 7,073,149 B2 | 7/2006 | Knol et al. |
| 7,143,199 B1 | 11/2006 | Ambrose |
| 7,673,257 B1 | 3/2010 | Bains et al. |
| 7,930,666 B1 | 4/2011 | Schmit et al. |
| 9,489,477 B2 | 11/2016 | Bjesse |
| 2003/0208730 A1 | 11/2003 | Singhal et al. |
| 2005/0050484 A1 | 3/2005 | Keller et al. |

(Continued)

FOREIGN PATENT DOCUMENTS

JP 2008033404 A 2/2008

OTHER PUBLICATIONS

Adams, Sara, et al., "Automatic Abstraction in Symbolic Trajectory Evaluation," Proc. of the Formal Methods in CAD conf. 2007, 23 pages.

(Continued)

*Primary Examiner* — Bryce Aisaka
(74) *Attorney, Agent, or Firm* — Haynes Beffel & Wolfeld LLP

(57) ABSTRACT

A computer implemented representation of a circuit design is reduced by representing the circuit design as a data structure defining a netlist. A first set of nodes is identified in the netlist that includes datapath nodes, preferably nodes that do not intermingle data and control. The first set of nodes is segmented into segment widths that correspond to uniformly treated segments of the corresponding words. A second set of nodes, including nodes that intermingle data and control, are converted into bit-level nodes. The segmented nodes are analyzed to define reduced safe sizes by applying a computer implemented function. An updated data structure representing the circuit design is then generated using the reduced safe sizes of the segmented nodes.

12 Claims, 14 Drawing Sheets

(56) References Cited

U.S. PATENT DOCUMENTS

| | | |
|---|---|---|
| 2005/0257184 A1 | 11/2005 | Fujita |
| 2007/0106963 A1* | 5/2007 | Baumgartner ........ G06F 17/504 716/103 |
| 2008/0228694 A1 | 9/2008 | Baumgartner et al. |
| 2011/0010141 A1 | 1/2011 | Jabir |

OTHER PUBLICATIONS

Armando, Alessandro, et al., "Abstraction Refinement of Linear Programs with Arrays," Proc. International Conference on Tools and Algorithms for the Construction and Analysis of Systems LNCS 4424 pp. 373-388, 2007.

Bjesse, Per, "A Practical Approach to Word Level Model Checking of Industrial Netlists," 20th Int'l Conf. on Computer Aided Design, Jul. 2008, 13 pages.

Bryant, Randal E., et al., "Modeling and Verifying Systems using a Logic of Counter Arithmetic with Lambda Expressions and Uninterpreted Functions," Lecture Notes in Computer Science; vol. 2404 archive, Proceedings of the 14th InternationalConference on Computer Aided Verification pp. 78-92 Year of Publication: 2002.

Burch, Jerry R., et al., "Automatic verification of Pipelined Microprocessor Control," In Proceedings of the 6th International Conference on Computer Aided Verification (Jun. 21-23, 1994). D. L. Dill, Ed. Lecture Notes in Computer Science, vol. 818.Springer-Verlag, London, 68-80.

Clarke, E. M., et al, "Word level model checking-avoiding the Pentium FDIV error.," In Proceedings of the 33rd Annual Conference on Design Automation (Las Vegas, Nevada, United States, Jun. 3-7, 1996). DAC '96. ACM, New York, NY, 645-648.

Clarke, Edmund, "Counterexample-Guided Abstraction Refinement," Proc. of the computer aided verification conf. 2000, 2 pages.

Galler, Bernard A., et al., "An Improved Equivalence Algorithm," Communications of the ACM archive, vol. 7 , Issue 5 (May 1964) pp. 301-303.

Ganai, Malay K., et al., "Efficient Modeling of Embedded Memories in Bounded Model Checking," in Proceedings of Computer Aided Verification (CAV), 2004 13 pages.

Ganai, Malay K., et al., "Verification of embedded memory systems using efficient memory modeling," Design, Automation and Test in Europe, 2005. Proceedings 2005 pp. 1096-1101 vol. 2.

Glokler, Tilman, et al., "Enabling Large-Scale Pervasive Logic Verification through Multi-Algorithmic Formal Reasoning," Formal Methods in Computer Aided Design, 2006. FMCAD '06, Nov. 2006 pp. 3-10.

Hojati, R. and Brayton, R. K. 1995. Automatic Datapath Abstraction in Hardware Systems. In Proceedings of the 7th International Conference on Computer Aided Verification (Jul. 3-5, 1995). P. Wolper, Ed. Lecture Notes in Computer Science, vol. 939.Springer-Verlag, London, 98-113.

IP, C. Norris, et al., "Better Verfication Through Symmetry," Formal Methods in System Design 9, 41-75, 1996.

Jain, Himanshu, et al., "Word-Level Predicate-Abstraction and Refinement Techniques for Verifying RTL Verilog," IEEE Transactions on Computer-Aided Design of Integrated Circuits and Systems, vol. 27, No. 2, Feb. 2008, 14 pages.

Johannsen, Peer, Dissertation, "Speeding Up Hardware Verification by Automated Data Path Scaling," Aug. 2002, 201 pages.

Manolios, Panagiotis, et al., "BAT: The Bit-Level Analysis Tool," Proceedings of Computer Aided Verification (CAV) 2007, LNCS 4590, pp. 303-306, 2007.

McMillan, K.L., "Verfication of an implementation of Tomasulo's algorithm by compositional model checking," In A. Hu and M. Vardi (editors) Proc. 10th International Conference on Computer Aided Verification (CAV'98), vol. 1427 of LNCS, pp. 110-121,Springer. 1998.

Peh, Li-Shivan, et al., "A Delay Model and Speculative Architecture for Pipelined Routers," Proc. 7th Int'l Symp on High-Performance Computer Architecture, Jan. 22-24, 2001, Monterrey, Mexico, pp. 255-266.

Pugh, William, "Skip Lists: A Probabilistic Alternative to Balanced Trees," Communications of the ACM, vol. 33, No. 6, Jun. 1990, 9 pages.

Ranise, Silvio et al, "Satisfiability Modulo Theories," p. 77-79, IEEE Nov./Dec. 2006, Trends & Controversies, Intelligent Systems and Formal Methods in Software Engineering.

Search Report dated Apr. 1, 2010 in PCT/US2009/05537 12 pages.

Search Report dated Mar. 31, 2010 in PCT/US2009/05530 10 pages.

Seger, Carl-Johan H., et al., "Formal Verification by Symbolic Evaluation of Partially-Ordered Trajectories," Technical Report. UMI Order No. TR-93-08., University of British Columbia, Jul. 1, 1999, 41 pages.

Sheeran, Mary, et al., "Checking Safety Properties Using Induction and a SAT-Solver," In Proceedings of the Third International Conference on Formal Methods in Computer-Aided Design (Nov. 1-3, 2000). W. A. Hunt and S. D. Johnson, Eds. Lecture Notesin Computer Science, vol. 1954. Springer-Verlag, London, 108-125.

\* cited by examiner

BEFORE MAKE COMPATIBLE:
   s1 = [0..0, 1..31] 
   s2 = [32..33, 34..63] 
AFTER:
   s1 = [0..0, 1..1, 2..32] 
   s2 = [32..32, 33..33, 34..63] 
FIG. 7

METHOD AND APPARATUS FOR WORD-LEVEL NETLIST PREPROCESSING AND ANALYSIS USING SAME

RELATED APPLICATIONS

This application is a continuation of U.S. patent application Ser. No. 12/236,646 filed on 24 Sep. 2008 (now U.S. Pat. No. 9,489,477), which application is incorporated herein by reference.

BACKGROUND

Field of the Invention

The present invention relates to integrated circuit design, and more particularly to electronic design automation tools and tools for verification and analysis of complex designs including memory.

Description of Related Art

Analysis of word-level designs, which leverages design information captured at a higher level than that of individual wires and primitive gates, is a new frontier in hardware verification. At the word level, data path elements and data packets are viewed as entities in their own right as opposed to a group of bit-level signals without any special semantics.

Today's model checking technology works well for checking control oriented properties. Typical model checking consists of an exhaustive state space exploration for verifying that some specified properties hold in the circuit design, and is a very intensive user of computing resources. However, it does not work well with designs where there are wide datapaths, and large memories. Previous approaches tried to speed up the process by reading designer annotations, or computing increasingly precise abstractions of the design. However, annotations are very time consuming for the designer, and the computation of abstractions can be as hard as solving the original problem.

There has been a lot of activity lately around word-level formula decision procedures such as SMT solvers (S. Ranise and C. Tinelli. *Satisfiability modulo theories. Trends and Controversies*—IEEE Intelligent Systems Magazine, December 2006) and reduction-based procedures like UCLID (R. Bryant, S. Lahiri, and S. Seshia. *Modeling and verifying systems using a logic of counter arithmetic with lambda expressions and uninterpreted functions*. In Proc. of the Computer Aided Verification Conf., 2002) and BAT (P. Manolios, S. Srinivasan, and D. Vroon. *BAT: The bit-level analysis tool*. In Proc. of the Computer Aided Verification Conf., 2007). However, as promising as this direction of research is, the use of these procedures for model checking is inherently restricted in that they analyze formulas rather than sequential systems. This has two consequences: First of all, sequential properties can only be checked by these procedures by relying on methods such as induction and interpolation that employ bounded checks to infer unbounded correctness. Second, these procedures do not fit into a transformation-based approach to sequential system verification (J. Baumgartner, T. Gloekler, D. Shanmugam, R. Seigler, G. V. Huben, H. Mony, P. Roessler, and B. Ramanandray. *Enabling large-scale pervasive logic verification through multi-algorithmic formal reasoning*. In Proc. of the Formal Methods in CAD Conf., 2006), where sequential verification problems are iteratively simplified and processed by any of a large set of back-end model checkers.

Therefore, it would be desirable to efficiently implement for practical word-level model checking of both bounded and unbounded properties for hardware designs. It is further desirable to accomplish this goal with technology that (1) requires little or no additional input from the user, (2) performs well compared to a straight bit-level sequential analysis of a given netlist, and (3) provides the possibility of speedups when there are significant parts of the design that can be treated on the word-level.

SUMMARY

A circuit representation can be preprocessed to provide an improved starting point for the analysis. Specifically, an input netlist can be swept to detect subgraphs where words are split up into bit-level signals, routed in a uniform way and recombined into word-level signals. These subgraphs are automatically re-implemented at the word-level.

A netlist reduction method is provided where a word-level netlist representing a sequential circuit design is abstracted to an equivalent but smaller netlist, which can be analyzed by standard verification tools and by other tools that operate on netlists.

A computer implemented representation of a sequential circuit design can be reduced in a method that includes representing the circuit design as a data structure defining a netlist including a plurality of nodes, such as in the form of a directed acyclic graph DAG. For example, a circuit design represented by a high-level description language can be processed to produce this type of data structure. A first set of word-level nodes is identified in the netlist that includes nodes having some data path segments that are treated uniformly. The first set of word-level nodes is segmented into segment widths that correspond to uniformly treated segments of the corresponding words. A second set of nodes that does not include uniformly treated segments as used for identifying the first set of nodes, are converted into bit-level nodes. The segmented nodes are analyzed to define reduced safe sizes by applying a computer implemented function. An updated data structure representing the circuit design is then generated using the reduced safe sizes of the segmented nodes. The updated data structure can then be analyzed to determine whether the circuit design satisfies a pre-specified property, such as a safety property, and in a preferred mode can fit into a transformation-based approach to sequential system verification in a data processing system used for integrated circuit design and manufacturing.

In implementations using the directed acyclic graph data structure mentioned above, top-level nodes in the graph include said word-level nodes representing circuit outputs and next-state variables; bottom-level nodes in the graph include said word-level nodes representing inputs, current state variables and binary constant vectors; and internal nodes in the graph include said word-level nodes representing operators.

The first set of nodes for a particular circuit design includes word-level nodes representing comparison operators for (equal to) and (not equal to), word-level nodes representing multiplexer operators, word-level nodes representing concatenation operators, word-level nodes representing extraction operators, word-level nodes representing inputs, word-level nodes representing state variables and word-level nodes representing binary constants. The second set of nodes for a particular design includes word-level nodes representing arithmetic operators, word-level nodes representing comparison operators for (less than), (less than or equal to), (greater than), and (greater than or equal to), word-level nodes representing logical AND operators, and word-level nodes representing logical NOT operators.

The segmenting and converting processes are facilitated by registering each node in the data structure and constructing a partition list for the node, identifying the segmentation of the node, and a dependency group including each segment of the node. The partition list and the dependency group constructed when the node is registered identifies a single segment of the node including bits (0. . . k−1) where the node has a width k. The dependency groups are maintained in the process so that they identify nodes that depend upon a particular node being registered, and nodes upon which it depends. The segmenting operation splits nodes within a particular dependency group that includes a particular node, until the segmentations of the nodes in the dependency group match. The converting operation splits nodes in the dependency group into single bit segments.

Preferably, the partition lists for nodes are maintained in a data structure organized for probabilistic search, such as a skip list data structure.

Reduced safe sizes are found in embodiments using dependency groups by processing the segments of nodes in the dependency groups to find reduced safe sizes for the segments, and then summing the segments for each node. A useful formula for finding reduced safe sizes is that the reduced safe size is min(S, $\log_2(N_S+2)$), where the dependency group includes a segments of width S, and a number $N_S$ of state variable and input segments of size S and at most 2 constants.

In addition to the segmenting and converting processes, where the plurality of nodes includes current state and the next state variables, the current state and next state variables are processed to ensure consistent segmentation.

The methods described herein combine fast static analysis that finds parts of signals that are treated as uniform "packets" with static reduction that resizes these packets to smaller sizes that preserve the provability status of properties subject of the verification procedures. Preferred embodiments can be implemented that (1) do not require user annotations, (2) as a result of the fact that the worst case reduction is the original system, are guaranteed to not slow down the solving, and (3) are extremely fast.

The technology described herein can be implemented as a process executed on a data processing machine, as a data processing machine adapted to execute the procedures described, and as a computer program executable by a data processing machine, and stored on a computer readable data storage medium. In addition, the technology herein is part of a process for manufacturing an integrated circuit including the development of data defining a pattern, such as layout data for a mask or a set of masks used in lithographic processes in integrated circuit manufacturing.

Other aspects and advantages of the present invention can be seen in the drawings, detailed description and claims which follow.

BRIEF DESCRIPTION OF THE DRAWINGS

FIG. 7 illustrates an operation to merge dependency groups for a set of nodes.

DETAILED DESCRIPTION

Figure 1:
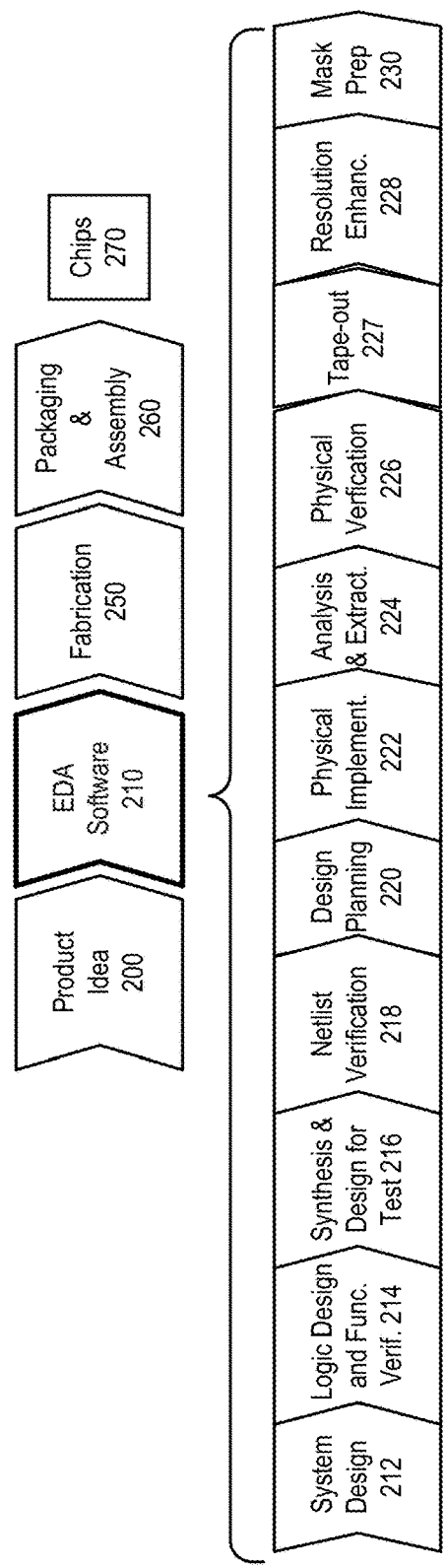
FIG. 1 shows a simplified representation of an illustrative integrated circuit design flow.

FIG. 1 is a simplified representation of an illustrative integrated circuit design flow. As with all flowcharts herein, it will be appreciated that many of the steps of FIG. 1 can be combined, performed in parallel or performed in a different sequence without affecting the functions achieved. In some cases a rearrangement of steps will achieve the same results only if certain other changes are made as well, and in other cases a rearrangement of steps will achieve the same results only if certain conditions are satisfied. Such rearrangement possibilities will be apparent to the reader.

At a high level, the process of FIG. 1 starts with the product idea (block 100) and is realized in an EDA (Electronic Design Automation) software design process (block 110). When the design is finalized, the fabrication process (block 150) and packaging and assembly processes (block 160) occur, ultimately resulting in finished integrated circuit chips (result 170).

The EDA software design process (block 110) is actually composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the components steps of the EDA software design process (block 110) will now be provided.

System design (block 112): The designers describe the functionality that they want to implement, they can perform what-if planning to refine functionality, check costs, etc. Hardware-software architecture can occur at this stage. Example EDA software products from Synopsys, Inc. that can be used at this step include Model Architect, Saber, System Studio, and DesignWare® products.

Logic design and functional verification (block 114): At this stage, Hardware Description Language (HDL) code, such as the VHDL or Verilog code, for modules in the system is written and the design is checked for functional accuracy. More specifically, the design is checked to ensure that it produces the correct outputs in response to particular input stimuli. Example EDA software products from Synopsys, Inc. that can be used at this step include VCS, VERA, DesignWare®, Magellan, Formality, ESP and LEDA products. The word-level netlist reduction technology described in more detail below can be implemented as a part of, or as an add-on tool, for the Magellan product for example.

Synthesis and design for test (block 116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, Test Compiler, Power Compiler, FPGA Compiler, TetraMAX, and DesignWare® products.

Netlist verification (block 118): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (block 120): Here, an overall floor plan for the chip is constructed and analyzed for timing and top-level routing. Example EDA software products from Synopsys, Inc. that can be used at this step include Astro and IC Compiler products.

Physical implementation (block 122): The placement (positioning of circuit elements) and routing (connection of the same) occurs at this step. Example EDA software products from Synopsys, Inc. that can be used at this step include AstroRail, Primetime, and Star RC/XT products.

Analysis and extraction (block 124): At this step, the circuit function is verified at a transistor level, this in turn permits what-if refinement. Example EDA software products from Synopsys, Inc. that can be used at this stage include AstroRail, PrimeRail, Primetime, and Star RC/XT products.

Physical verification (block 126): At this stage various checking functions are performed to ensure correctness for: manufacturing, electrical issues, lithographic issues, and circuitry. Example EDA software products from Synopsys, Inc. that can be used at this stage include the Hercules product.

Tape-out (block 127): This stage provides the "tape-out" data for production of masks for lithographic use to produce finished chips. Example EDA software products from Synopsys, Inc. that can be used at this stage include the CATS(R) family of products.

Resolution enhancement (block 128): This stage involves geometric manipulations of the layout to improve manufacturability of the design. Example EDA software products from Synopsys, Inc. that can be used at this step include Proteus/Progen, ProteusAF, and PSMGen products.

Mask preparation (block 130): This stage includes both mask data preparation and the writing of the masks themselves. Example EDA software products from Synopsys, Inc. that can be used at this stage include CATS(R) family of products.

Embodiments of the netlist reduction technology described herein can be used during one or more of the above-described stages. For example, embodiments of the present invention can be used during logic design and functional verification (block 114 of FIG. 1). At this stage, the VHDL or Verilog code for modules in the system is written and the design is checked for functional accuracy. More specifically, the design is checked to ensure that it produces the correct outputs in response to particular input stimuli.

Figure 2:
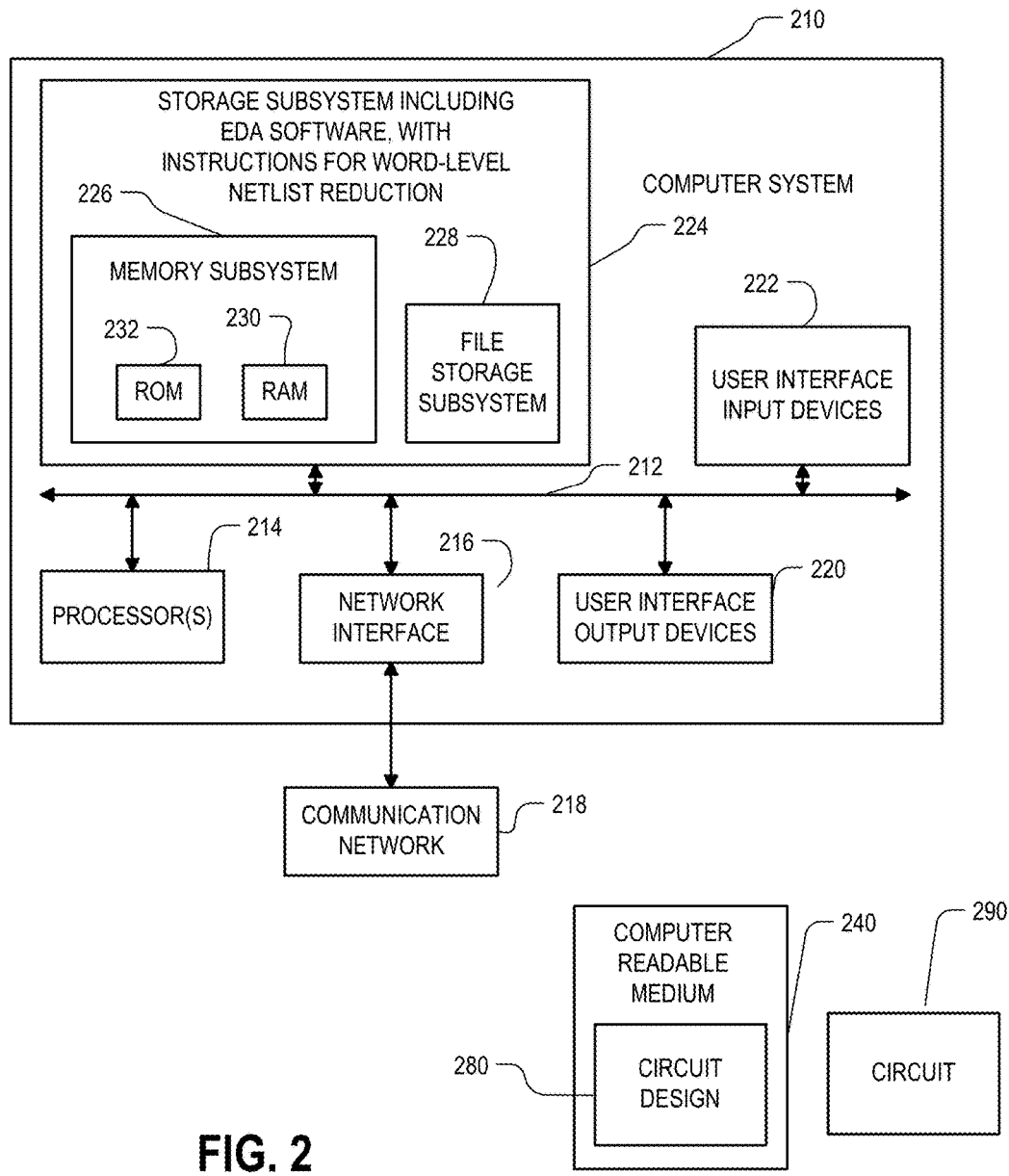
FIG. 2 is a simplified block diagram of a computer system suitable for use with embodiments of the technology, as well as a circuit design and circuit embodiments of the technology.

FIG. 2 is a simplified block diagram of a computer system 210 suitable for use with embodiments of the technology. Computer system 210 typically includes at least one processor 214 which communicates with a number of peripheral devices via bus subsystem 212. These peripheral devices may include a storage subsystem 224, comprising a memory subsystem 226 and a file storage subsystem 228, user interface input devices 222, user interface output devices 220, and a network interface subsystem 216. The input and output devices allow user interaction with computer system 210. Network interface subsystem 216 provides an interface to outside networks, including an interface to communication network 218, and is coupled via communication network 218 to corresponding interface devices in other computer systems. Communication network 218 may comprise many interconnected computer systems and communication links. These communication links may be wireline links, optical links, wireless links, or any other mechanisms for communication of information. While in one embodiment, communication network 218 is the Internet, in other embodiments, communication network 218 may be any suitable computer network.

User interface input devices 222 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 210 or onto computer network 218.

User interface output devices 220 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 210 to the user or to another machine or computer system.

Storage subsystem 224 stores the basic programming and data constructs that provide the functionality of some or all of the EDA tools described herein, including the netlist reduction technology and verification tools applied for analysis of the reduced netlist. These software modules are generally executed by processor 214.

Memory subsystem 226 typically includes a number of memories including a main random access memory (RAM) 230 for storage of instructions and data during program execution and a read only memory (ROM) 232 in which fixed instructions are stored. File storage subsystem 228 provides persistent storage for program and data files, and may include a hard disk drive, a floppy disk drive along with associated removable media, a CD-ROM drive, an optical drive, or removable media cartridges. The databases and modules implementing the functionality of certain embodiments may be stored by file storage subsystem 228.

Bus subsystem 212 provides a mechanism for letting the various components and subsystems of computer system 210 communicate with each other as intended. Although bus subsystem 212 is shown schematically as a single bus, alternative embodiments of the bus subsystem may use multiple busses.

Computer readable medium 240 can be a medium associated with file storage subsystem 228, and/or with network interface subsystem 216. The computer readable medium can be a hard disk, a floppy disk, a CD-ROM, an optical medium, removable media cartridge, or electromagnetic wave. The computer readable medium 240 is shown storing a circuit design 280, including for example an HDL description of a circuit design, and a reduced netlist created with the described technology. Also shown is a circuit 290 created with the described technology.

Computer system 210 itself can be of varying types including a personal computer, a portable computer, a workstation, a computer terminal, a network computer, a television, a mainframe, or any other data processing system or user device. Due to the ever-changing nature of computers and networks, the description of computer system 210 depicted in FIG. 2 is intended only as a specific example for purposes of illustrating the preferred embodiments. Many other configurations of computer system 210 are possible having more or less components than the computer system depicted in FIG. 2.

Figure 3:
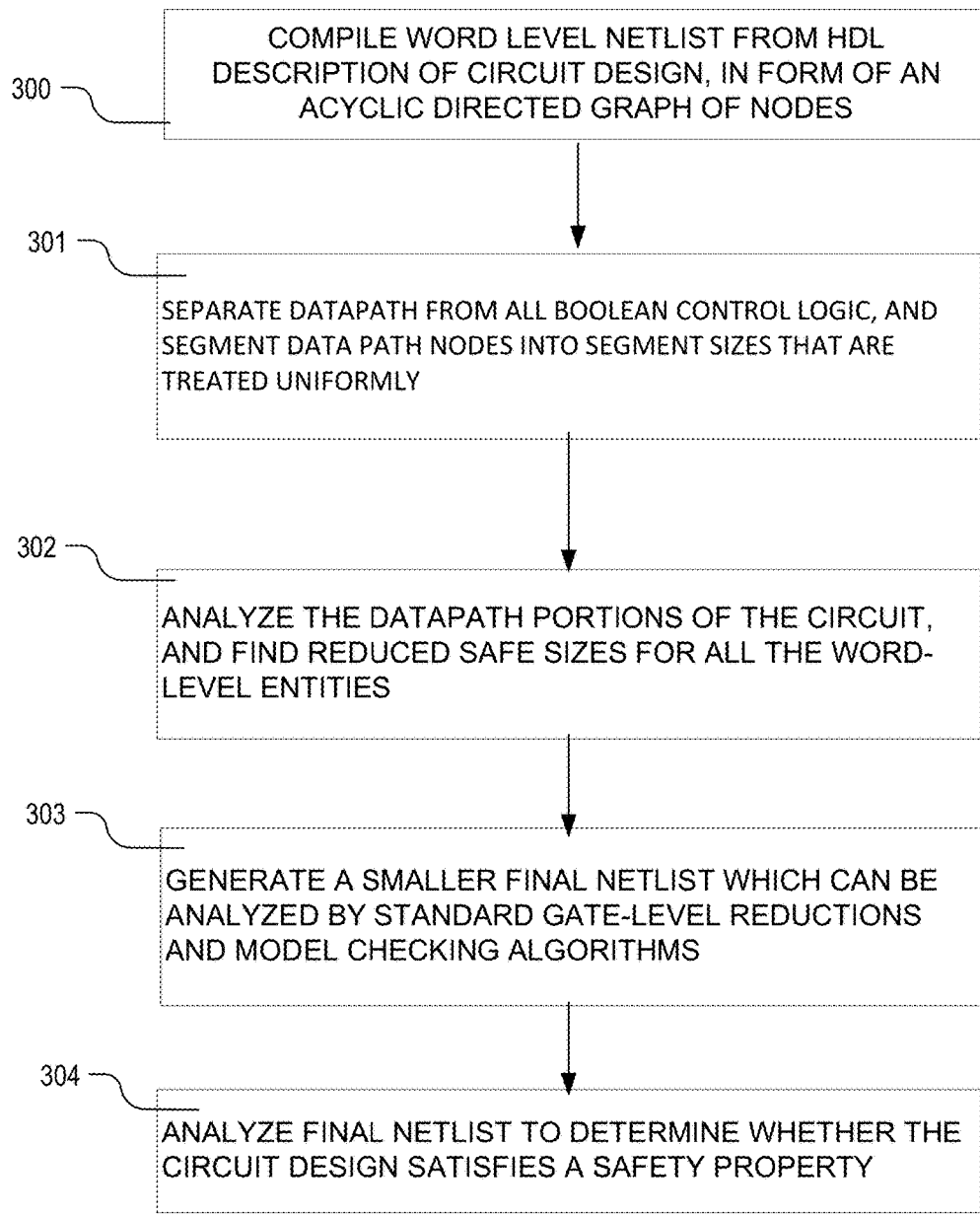
FIG. 3 is a simplified flow chart for a process for reducing the size of a data structure representing a circuit design, and performing a verification process using the reduced data structure.

FIG. 3 is a basic flowchart for a process for performing a verification step for a circuit design that includes operating on a reduced netlist. In the process of FIG. 3, a word-level netlist including a plurality of nodes is compiled from a high-level description language description of a circuit design, preferably in the form of a directed acyclic graph of nodes (block 300). A standard front end flow takes a Register Transfer Level (RTL) description expressed for example in Hardware Description Language (HDL), supplemented with the definitions of user constraints, properties and other information, and produces the implicitly clocked DAG representation described in detail below. A standard front end flow is used which compiles a circuit design into netlists by processing a hardware design with properties and constraints into a plurality of nodes representing combinational logic over a set of unconstrained inputs I, state variables S and constants. The top of the resulting plurality of nodes contain next-state variables S' and single bit outputs O. The properties which can be verified using this technology include all properties whose failure is signaled by some output assuming the value "false", including safety properties. A safety property is a subclass of properties of circuit design, which has the form that some output always holds (i.e., whose failure can always be shown by a finite trace). In addition, each state variable can be assumed to have a fully or partially unknown initial state in some embodiments.

The internal nodes in a graph compiled in this manner include the following:
- node1=not(node2)
- node1=and(node2, node3)
- node1=arithOp(node2, node3), for arithOp being a member of {+, . . . }
- node1=compOp(node2, node3), for compOp being a member of {less than, less than or equal to, equal to, not equal to, greater than or equal to, greater than}
- node1=mux(selector, node2, node3)
- node1=extract(x, node2)
- node1=concat(node2, node3, . . . )

The "not" and "and" operators are bitwise operators in the sense that bit i of the result is generated by applying the Boolean operator to bit i of the input nodes. The "mux" node returns node2 if selector is true and node 3 otherwise. The "extract" node constructs a smaller bit vector by projecting out k bits from position (x) to (x+k−1) of its operand. Finally, the "concat" node forms a larger signal by concatenating its operands to form a larger bit vector. Earlier operands in the argument list to concat become higher order bits, so concat (01, 00) becomes 0100.

The select signal of mux and the output of comparison operator nodes are restricted to have a bit width of one. Such signals are said to be bit-level signals. Signals that are not bit-level signals, are referred to as word-level signals. The term "segment" denotes a group of contiguous bits, and can refer to an entire word, or parts of a word.

Returning to the flow chart in FIG. 3, the plurality of nodes is analyzed to separate datapath nodes from control logic, and to segment the datapath nodes into segment sizes that are treated uniformly (block 301). The segmented datapath portions of the circuit are analyzed to find reduced safe sizes for all word-level and segmented nodes (block 302). A smaller final netlist is generated using the reduced safe sizes which can be analyzed by standard gate-level reductions in model checking algorithms (block 303). The final netlist is analyzed to determine for example, whether the circuit design satisfies a safety property specified by circuit verification tools (Block 304).

Figure 4:
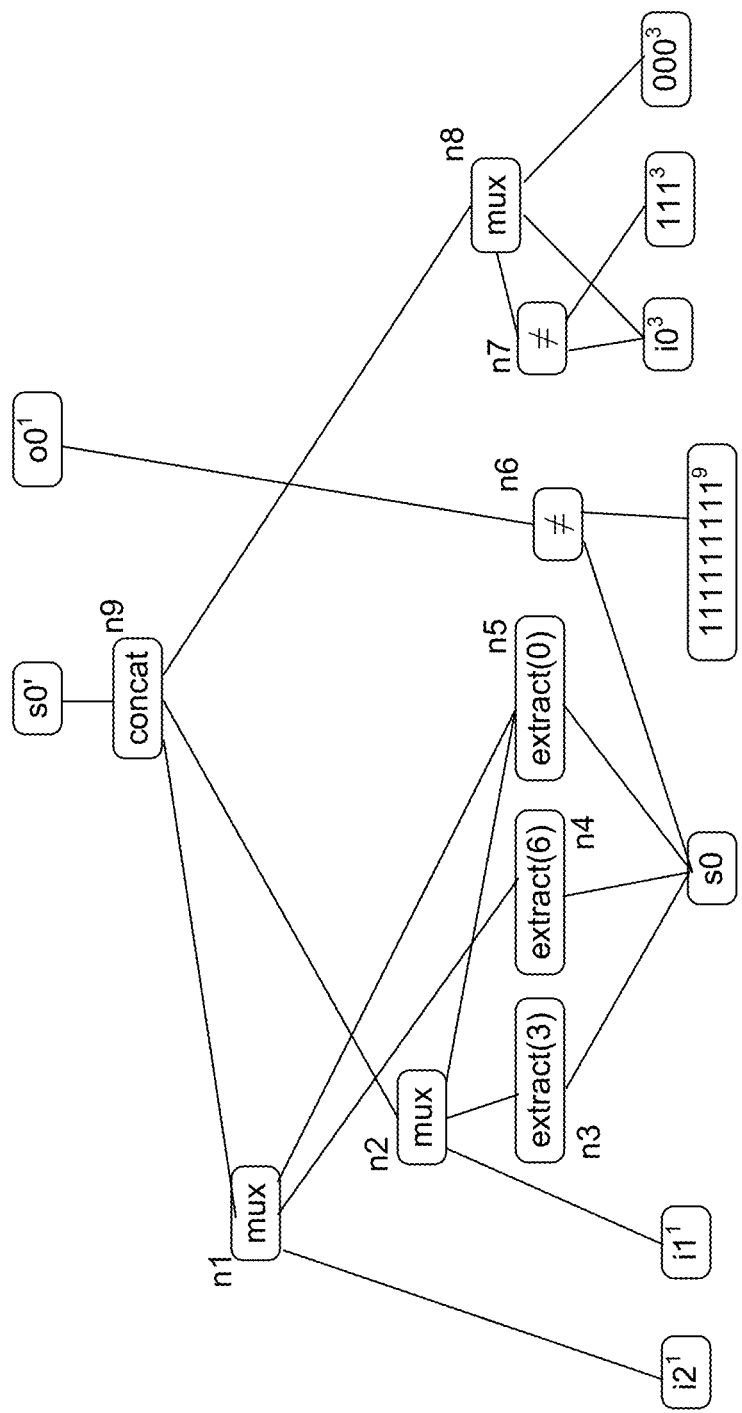
FIG. 4 is a representative example of a netlist implemented as a directed acyclic graph including a plurality of nodes.

FIG. 4 illustrates a netlist implemented as a directed acyclic graph, where top-level nodes include word-level (and/or bit-level) nodes representing circuit outputs (o0) and next-state variables (s0'), where bottom-level nodes include word-level (and/or bit-level) nodes representing inputs (i0, i1, i2), initial state variables (s0) and binary constant vectors (111111111, 111, 000), and where internal nodes include word-level (and/or bit-level) nodes representing operators (n1-n9). In FIG. 4, the superscripts shown adjacent to the node indicators represent widths of the nodes, where the width corresponds with the number of bits. The initial state for $s0^9$ is set during initialization to using an initialization vector $000000000^9$, and the property of interest is that output $o0^1$ is always true. The circuit generates the next state s0' for state variable s0 by concatenating three parts. The lowest part is a fresh input value i0, but only if it is not equal to 111 (otherwise it switches in 000). The other two segments are the result of either keeping the current 2 lower order segments (0 . . . 2) and (3 . . . 5) of s0, or swapping in the low order segment (0 . . . 2) of s0 with the upper order segment (6 . . . 9) of s0, depending on the value of two externally controlled inputs i1 and i2. Hence, the system is safe in that the output can never become false. Each node in the graph has an associated signal width k. At places in the present description, the nodes are annotated with a superscript to denote the signal width.

One can see that the circuit design represented in the structure shown in FIG. 4, or in a similar data structure, can be "bitblasted" into an equivalent bit-level netlist by splitting all the variables into single bit segments, and implementing the internal nodes in terms of Boolean, single bit logic. This would result in a netlist where all the signals have a width of one, and the internal nodes are Boolean operators. In order to provide a reduced, word-level netlist as described herein, selective bit blasting is performed by traversing the graph in a depth first manner, identifying segments of datapath nodes that treated uniformly and segmenting these nodes accordingly. All other operators are translated into bit-level constructs. Then, a reduced safe size for the segmented nodes is identified and an updated netlist is generated using the reduced safe sizes for the segmented nodes, and the bit-level constructs.

A technique for performing this analysis involves annotating each node in the graph with information on which of its segments are treated as word-level packages; that is, units of data that are treated uniformly. Analysis of this type to reduce formulas, rather than sequential systems as described here, is described in P. Johannesen, "*Speeding up hardware verification by automated datapath scaling,*" Ph.D. thesis, Christian-Albrechts-Universität zu Kiel, 2002, which is incorporated by reference as if fully set forth herein.

Figure 5:
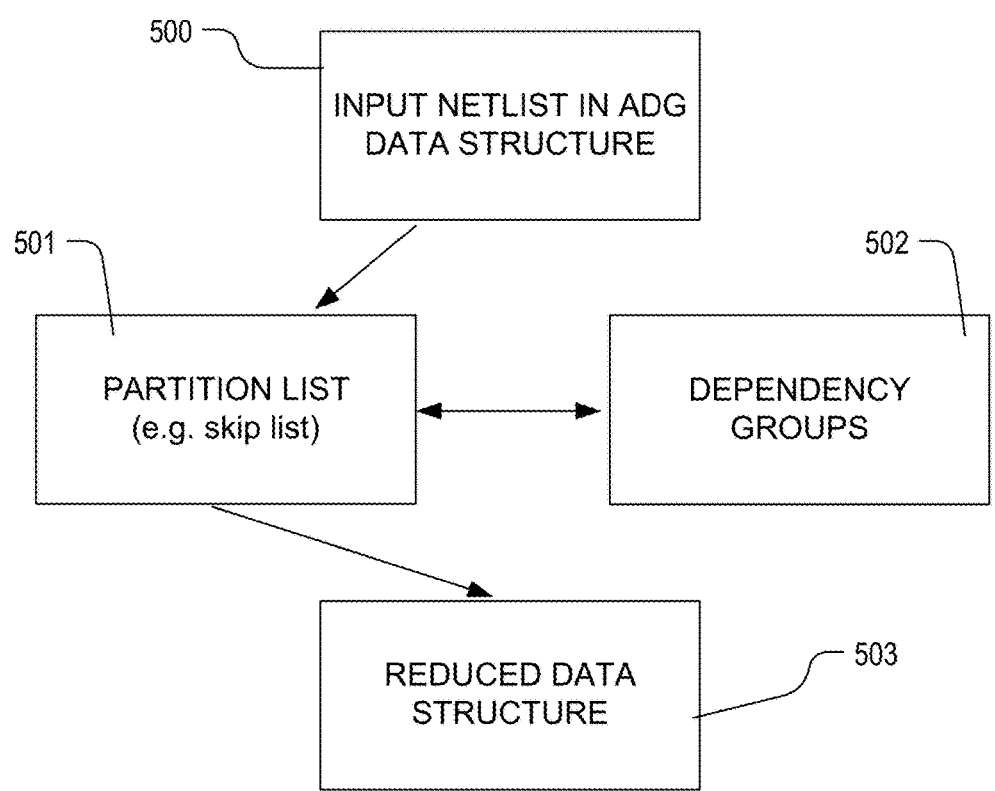
FIG. 5 is a simplified drawing showing data structures used in the process of FIGS. 9-13.

FIG. 5 illustrates a simplified data organization for use in a data processing machine performing the process, including the input data structure 500 in which a circuit design is represented by a plurality of nodes arranged as a directed acyclic graph, a partition list 501 containing segmentation information identifying the partitions in the nodes, a list 502 of dependency groups for the segments in the partition list 501, and a reduced data structure 503 provided as output of the process. The partition list 501 maintains a partition at each node into bit segments. For each bit segment of every node, a dependency class is maintained in list 502 that includes segments of nodes that depend on the segment, or that the segment depends upon, and reduced data structure 503 is processed as a result of the procedures described herein.

The data structures are processed using operations on dependency groups and intervals, including registerNode(n), split(n,j), mkCompatible(n1, n2, . . . ), bitblast(n) and MergeDepGps(n1, n1, . . . ).

The creation operator, registerNode(n) adds a node n, having a segment (0 . . . k−1) in the partition list, and constructs a singleton dependency group containing the segment (0 . . . k−1), assuming the node has k bits.

Figure 6:
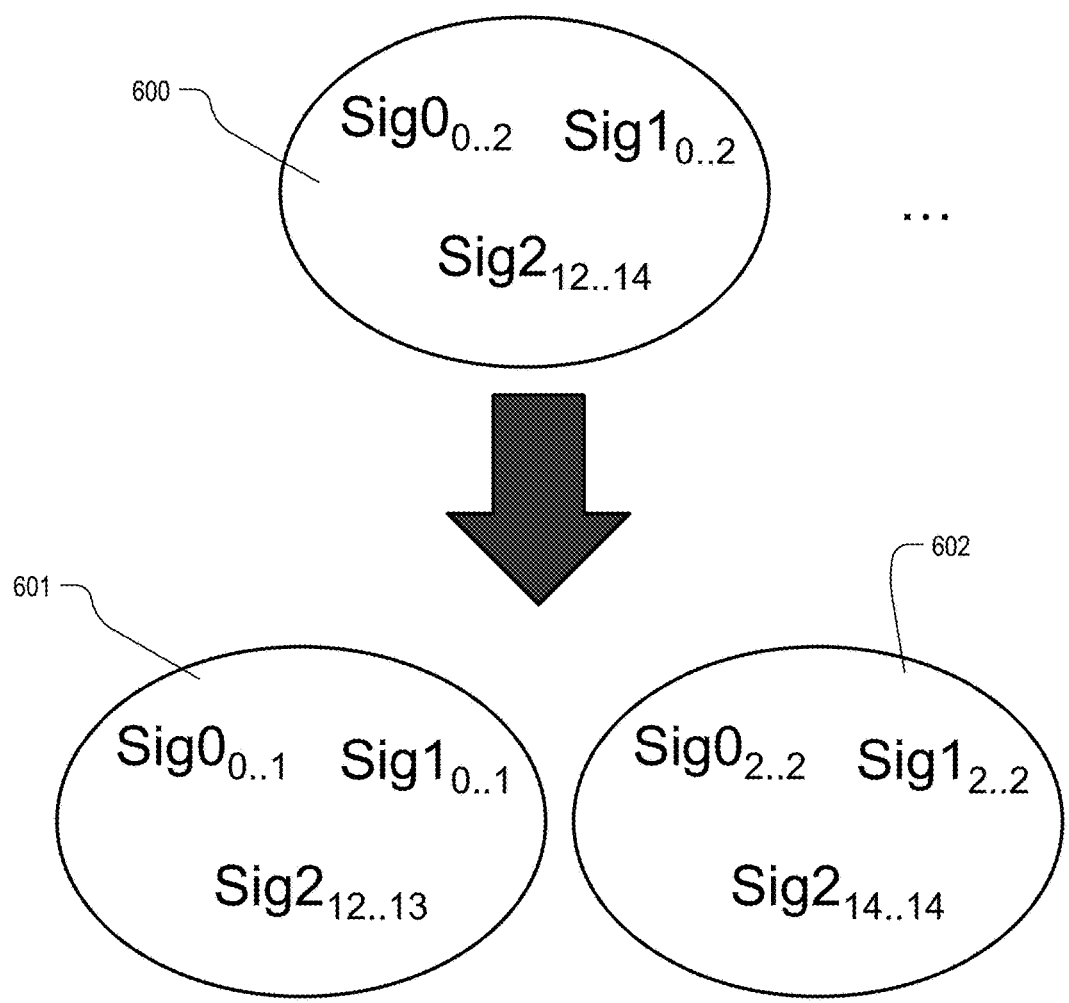
FIG. 6 illustrates an operation to split a partitioned node.

The refining operators split(n,j), mkCompatible(n1, n2, . . . ), and bitblast(n) perform the following functions:

1. split(n, j): This operator finds the segment dependency group for node n that contains the bit j. If the bit j falls internally to the segment interval i . . . k, so that i<j<k, then the dependency group is split into two new groups, the first containing the j−i first bits of each segment, and the other containing the remaining bits of each segment. FIG. 6 illustrates the results of a split operation for the group 600 on the location 1. Thus, the dependency group 600 includes three segments having a width of three bits: Sig0(0 . . . 2), Sig1(0 . . . 2), Sig2(12 . . . 14). After the split (Sig0,1), dependency groups 601 and 602 result, where dependency group 601 includes three segments having a width of two bits: Sig0(0 . . . 1), Sig1(0 . . . 1), Sig2(12 . . . 13); and the dependency group 602 includes three segments having a width of one bit: Sig0(2 . . . 2), Sig1(2 . . . 2), Sig2(14 . . . 14). One can transfer the segmentation of a first node to a target node, by using the split to introduce cuts in the target node at all positions where there are cuts in the first node.

2. mkCompatible(n1, n2, . . . ): This operator applies the split operator to its operands until their segmentations match. FIG. 7 illustrates the results of mkCompatible(s1, s2), where before the operation node s1 includes two segments, including a single bit segment 0 . . . 0 and a 31 bit segment 1 . . . 31, while node s2 includes two segments, including a two bit segment 32 . . . 33 and a 30 bit segment 34 . . . 63. In order for the segmentations to match, the 31 bit segment in node s1 must be split at location 1, and the two bit segment in node s2 must be split at location 1, resulting in matching segmentations as illustrated in the figure including three segments in both nodes s1 and s2, including two single bit segments and one 30 bit segment. After the make compatible operation mkCompatible(n1, n2, . . . ) is completed on a set of nodes, the segmentation of the nodes in the set is consistent with that of all other nodes in the set, because all the cuts in one of the nodes will then exist in all the other nodes.

3. bitblast(n): This operator applies the split operator to a node n until it is segmented into single bit slices.

The merge operator MergeDepGps(n1, n1, . . . ) takes a number of nodes whose segmentations match, having the same number of segments. The merge operator generates k new dependency groups by merging the dependency groups for all the first segments of its operands, merging the dependency groups for all the second segments of its operands and so on until k new dependency groups are formed.

Figure 8:
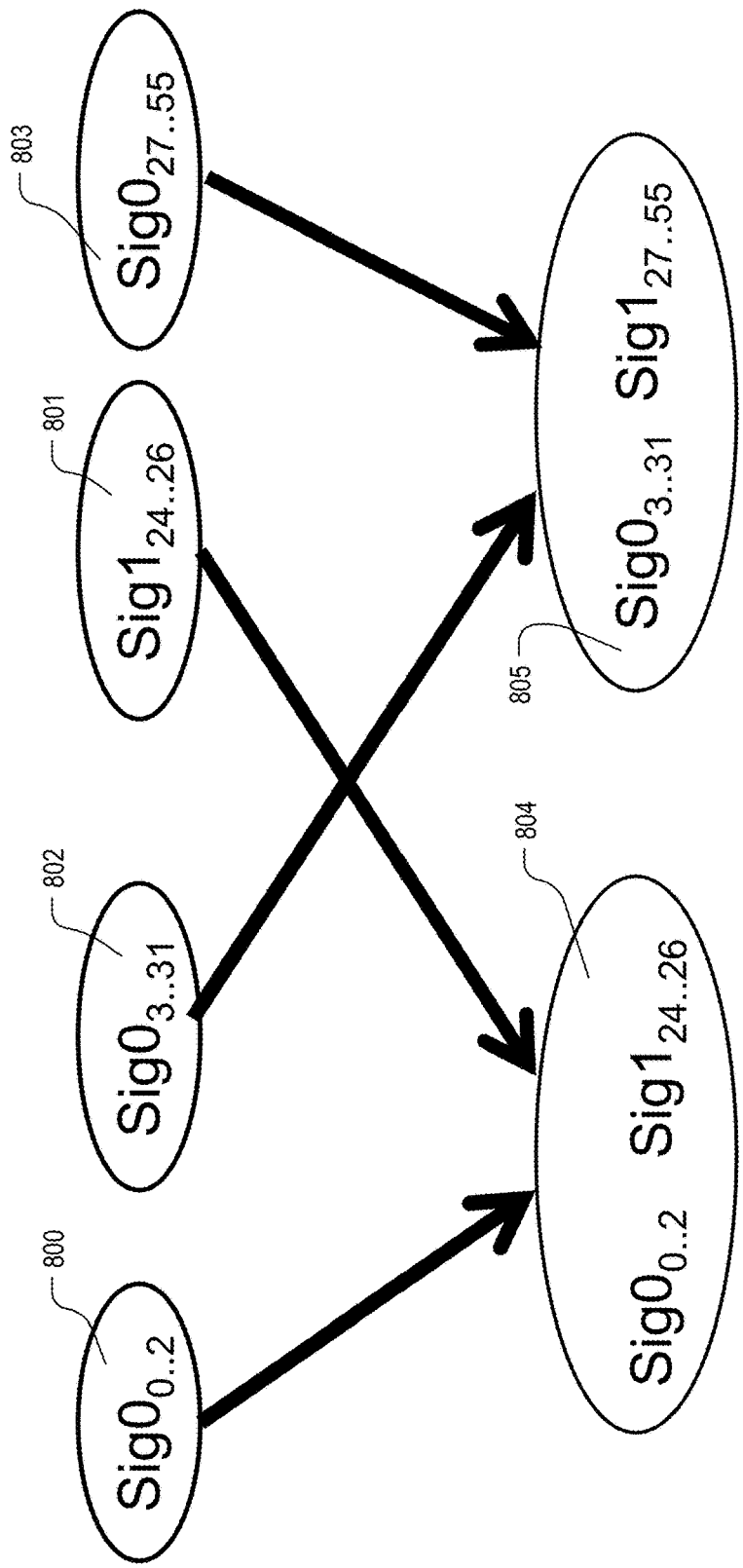
FIG. 8 illustrates an operation to make a set of nodes compatible.
Figure 9:
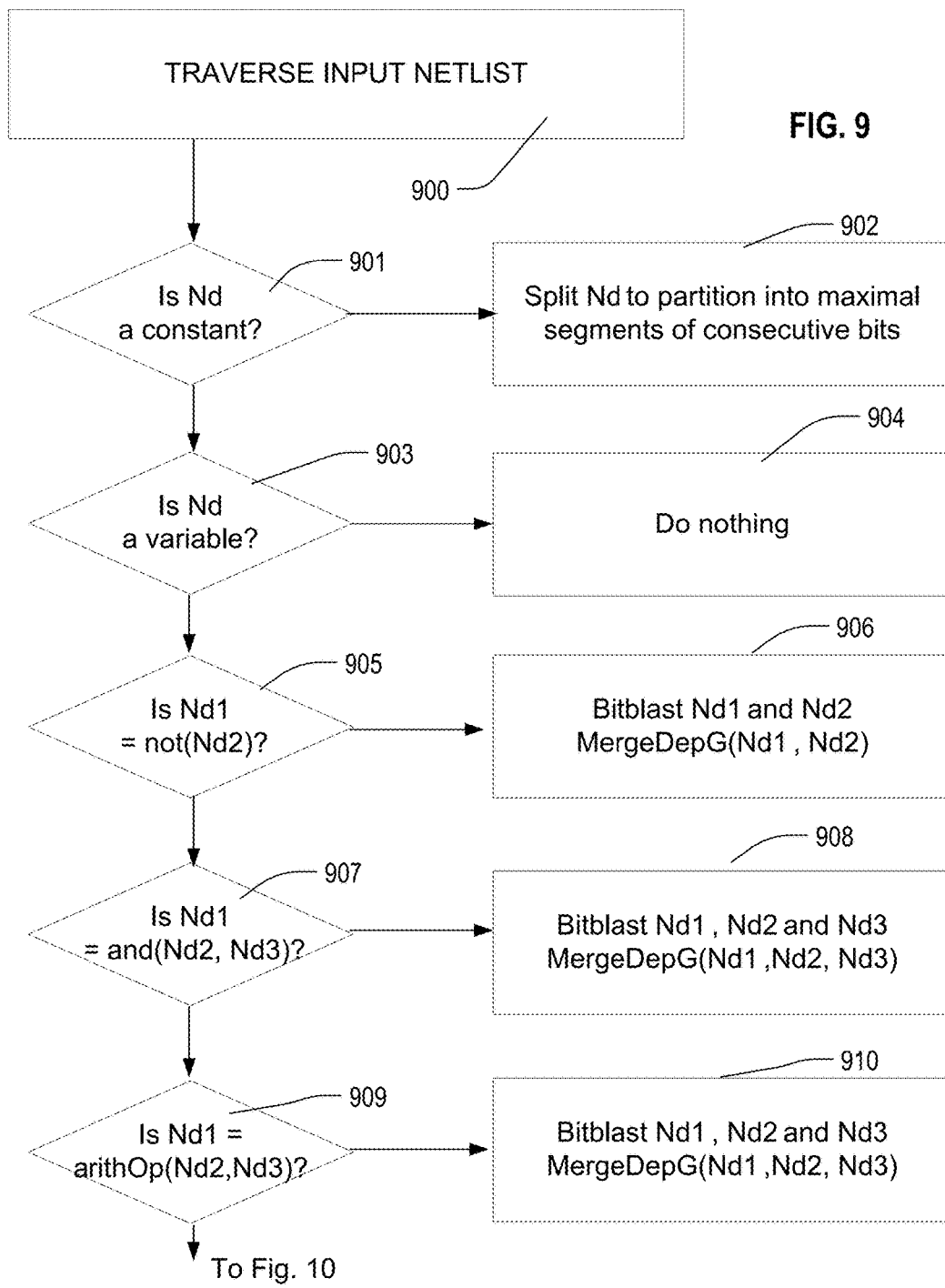
FIGS. 9-13 show a more detailed flow chart of a process for reducing the size of a data structure representing a circuit design.

FIG. 8 illustrates the merge dependency group operation for nodes Sig0 and Sig1, where each of the nodes has a three bit segment (800, 801) and a 29 bit segment (802, 803). As a result of the operator, two new dependency classes (804, 805) are created which contain segments from both nodes Sig0 and Sig1.

FIGS. 9-13 illustrate a process for traversing an input data structure to produce a reduced netlist as described herein. The data flow analysis is performed by traversing the nodes in the data structure, which preferably has the form of a directed acyclic graph as mentioned above, in a depth first recursive manner where each node encountered is registered using the registerNode operator, and then processed (block 900).

If the node is a constant (block 901), the split operator is used to partition the node into its maximal segments of consecutive bits of the form 00 . . . 0 and 11 . . . 1(block 902). Thus, the constant 000100 having the six locations 0-5, would be split into the segments (0,1), (2,2) and 3,5). Other techniques can be applied to constants which do not restrict the number of constants by dependency group to 2, including specific processing for each dependency group, or for selected types of dependency groups. The technique restricting the constants to 2, as described here is simple and fast, but may not lead to optimum segmentations.

If the node is a variable (block 903) then nothing is done (block 904).

If the node is the "not" in operator of the form node1 equal NOT node2 (block 905), then the bit blast operator is applied on node1 and node2, and then the merge dependency group operator is applied (block 906).

If the node is the "and" operator of the form node1 equal AND (node2, node3) (block 907), then the bit blast operator is applied on node1, node2 and node3, and then the merge dependency group operator is applied (block 908).

If the node is an arithmetic operator of the form node1 equal ARITHOP (node2, node3) (block 909), then the bit blast operator is applied on node1, node2 and node3, and then the merge dependency group operator is applied (block 910).

Figure 10:
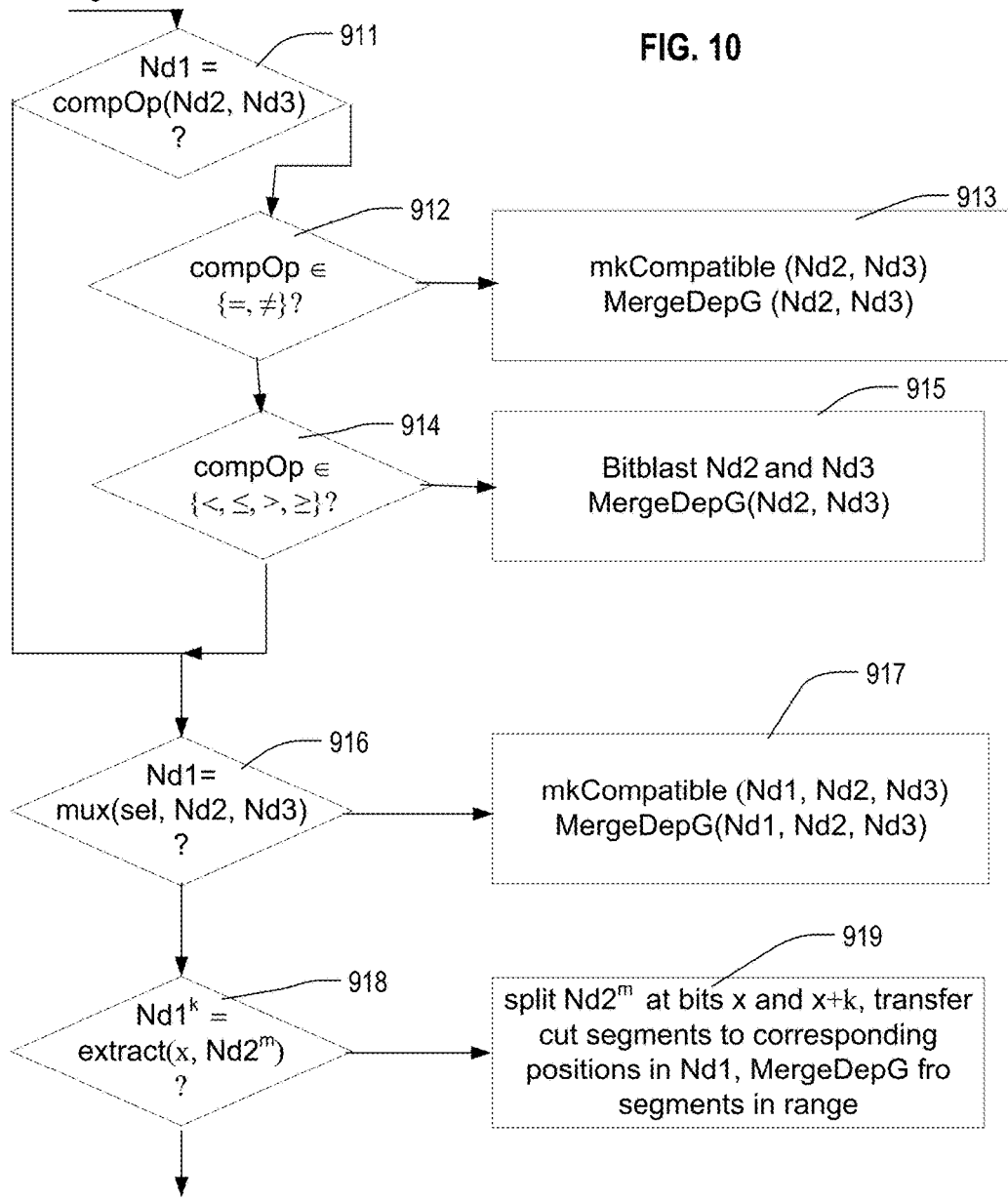

Proceeding to FIG. 10, if the node is a comparator operator of the form node1 equal compOp(node2 and node3), then the operation depends upon the type of operator (block 911). If the operator one of the "equal to" or "not equal to" operators (block 912), then the make compatible operator is applied over node1 and node2, and then the merge dependency group operator is applied (block 913). If the operator is one of the "less than", "less than or equal to", greater than or equal to" and "greater than" operators (block 914), then the bit blast operator is applied on node1 and node2, and then the merge dependency group operator is applied (block 915).

If the operator is a multiplexer operator of the form node1 equal MUX (selector, node2, node3) (block 916), then the make compatible operator is applied over node1, node2 and node3, and then the merge dependency group operator is applied (block 917).

If the operator is an extraction operator of the form node1$^k$ equal EXTRACT (x, node2$^m$) (block 918), then the split operator is used to introduce cuts at bit position x, and bit position x+k, if x+k is less than the width m of node2, where k is the width of node1. Then, all the segment cuts in the region between bit position x, and bit position x+k, and node2 are transferred to node1. Then the merge dependency group operator is applied for node1 and node2 (block 919).

Figure 11:
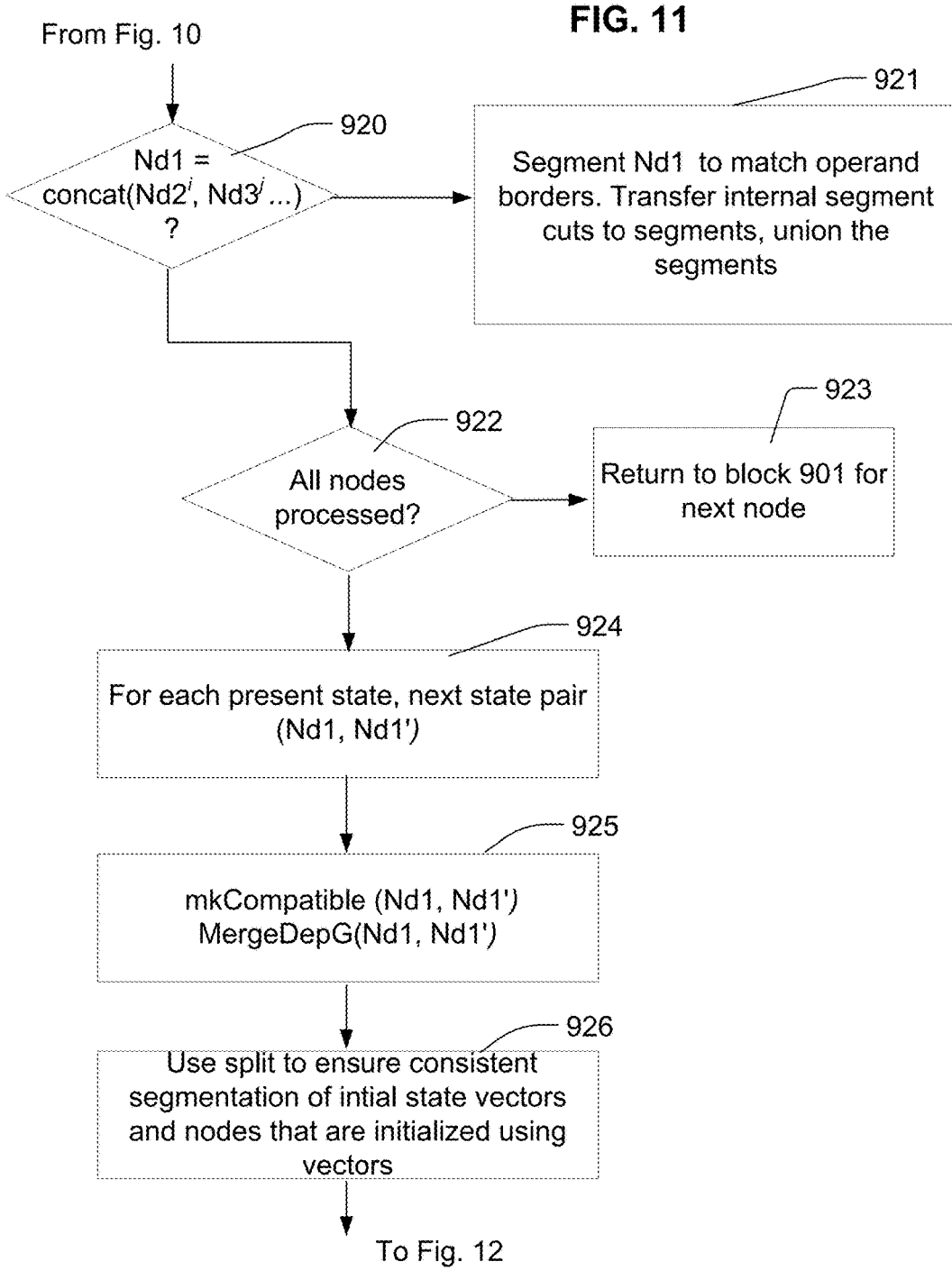

Proceeding to FIG. 11, if the operator is a concatenation operator of the form node1 equal concat(node2$^i$, node3$^j$ ... ) (block 920), then node1 is segmented to match the operand borders (i.e. location i, location i+j, etc.), and all of the internal segment cuts in the operands are transferred to the corresponding points in node1. Then the merge dependency group operator is applied for node1 and node2 (block 921).

For example, consider the verification problem from FIG. 4. Assume we traverse the netlist by first visiting s0. This creates the partition information s0: (0 ... 8) in a singleton dependency group. After visiting nodes n3, n4, n5, i1, n2, i2 and n1 we have the new segmentation s0: (0 ... 2), (3 ... 5), (6 ... 8). The dependency group of s0: (0 ... 2), now contain the other elements n1: (0 ... 2), n2: (0 ... 2), n3: (0 ... 2), n4: (0 ... 2), n5: (0 ... 2), s0: (3 ... 5) and s0: (6 ... 8).

Next, it is determined whether all the nodes in the input data structure have been processed (block 922). If not, then the procedure returns to block 901 for a new node (block 923). If they have all been processed, then all current-state and next-state variable pairs, (node1, node1') are traversed (block 924). First, the make compatible operator is applied for each pair, and the merge dependency group operator is applied for each pair (block 925). Finally, the split operator is used to ensure that the segmentation of each current state node is consistent with the segmentation of its initial state vector, which vector is used to set the value of a current state node when the simulation is started and which is segmented as a constraint like a constant as described with reference to block 901 (block 926).

After performing the data flow analysis, segment information for each node will result, with assurance that (1) the segmentation of current and next-state variables is consistent, (2) the segmentation of current-state variables and initial-state variables is consistent, and (3) the segment sources of size greater than one of the netlist DAG will only be propagated through multiplexor networks or be compared using the operators {equal to, not equal to}.

Figure 12:
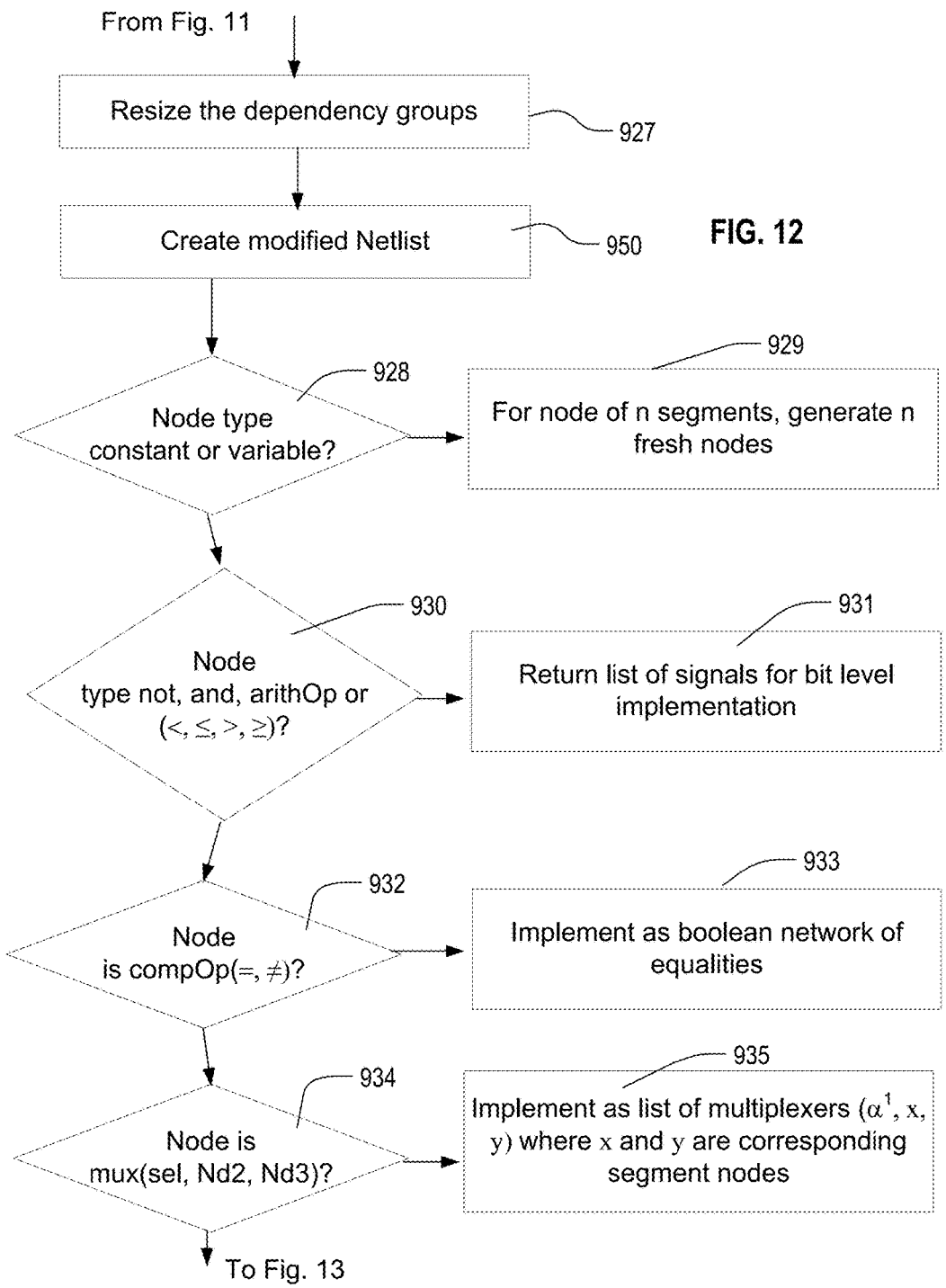

Proceeding to FIG. 12, at about this stage in the process, the algorithm visits each dependency group, and computes a new reduced size for the segments in the group by applying a resizing formula which guarantees that all properties of the node are preserved. The nodes are resized to the sum of the resized segments of the node (block 927). A resizing formula useful in step 927 can be explained as follows. The selectively bitblasted netlist now has two components: (1) A word-level component that reads packages from the inputs and word-level registers, moves them around using multiplexors, and performs package comparisons, and (2) A bit-level component that reads bit-level signals from the inputs, controls the multiplexors (possibly based on the outputs from comparison operators), and computes bit-level outputs. As the word-level variables are only compared for equality and inequality and moved around, they can be abstracted to provide reduced widths.

In a 1995 paper, Hojati and Brayton introduce a reduction for designs they refer to as Data Comparison Controllers (DCCs) (R. Hojati and R. Brayton. *Automatic datapath abstraction in hardware systems*, Proc. of the Computer Aided Verification Conf., 1995). These designs are partitioned into a boolean part and a datapath part that manipulate infinite packets modeled as integers by moving them around and comparing them, like the selectively bitblasted designs of the process described here. It is shown in Hojati and Brayton's paper that for every DCC, there always exists a finite smallest package size that preserves the status of the properties of the design. In fact, if the system has N infinite integer variables and M integer constant nodes, the integers can safely be modeled using length $S_{min}=[\log_2(N+M)]$ bit vectors.

This result cannot be applied directly here for two different reasons: (1) the selectively bitblasted packages do not have infinite initial size; and (2) there is more than one package size. However, as long as an initial packet size for a particular node is greater than some determinate minimum packet size, then the properties of the node will hold as long as a resized node is at least as large as the minimum of the initial packet size and the minimum packet size. A reduced safe size is determined for each dependency group, having an initial width greater than one. If the dependency group contains a number n constants, and a number m input and variable slices, then the reduced safe size is defined as: $\min(w_i, \log_2(n+m))$. Also note that due to the partitioning of constants in the example procedure described above, every dependency group can have at most one "all zeroes" constant and one "all ones" constant, as described above. So, M (the number of constants of a particular length) is always less than or equal to two in this example. Of course, other techniques for handling constants can be used, in which there are more than 2 possible constants as mentioned above.

After selective bitblasting, the resulting netlist has no facility for converting a size N word-level segment into some other size segment. Segments of a different width can hence not be compared, or registered in the same word-level register slices. The converted designs are therefore generalized DCCs, with one bit-level component, and a finite number of separate word-level components that only communicate with each other using bit-level signals. By iterating the argument in Hojati and Brayton, it can be seen that each of these word-level components can be abstracted individually. Therefore, reduced safe size can be computed as follows:

For each segment of size S in a node in a particular dependency group, there exists a number $N_S$ of state variable and input segments of size S in the dependency group. All properties of the selectively bitblasted netlist are preserved if the size S is adjusted to have a new size that is the $\min(S, \log_2(N_S+2))$. This results in a simple safe width. Also, other formulas or processes can be applied to find the minimum safe size, including more rigorous evaluation of the circuit represented by each dependency group to find a minimum safe size that may be smaller than found using the technique above.

When all word-level state variables and constants have been sized, the abstracted netlist is computed by rewriting the word-level components of the selectively bitblasted design to use variables and constants of the new correct size, and adjusting the width of the internal operators. So, returning to FIG. 12, the procedure progresses to produce a modified word-level netlist (block 950) by converting each node in the original netlist into a list of new nodes, including one node per segment.

The modified netlist is produced by traversing the nodes, determining the type of node, and then performing an appropriate operation as follows. If the node is a variable or constant node having a number n segments (block 928), then a list of the number n nodes is produced having the same node type, and sized according to the sizes assigned to the dependency groups of the segments (block 929).

If the node is one of a "not" and "and", arithmetic operator, and a comparator operator of the type "less than", "less than or equal to", "greater than", and "greater than or equal to" (block 930), then the previous processing will have produced single bit segmentation (bitblasted). So the resulting list of signals is returned corresponding to the bit-level implementation of the operator in terms of its inputs (block 931).

If the node is a comparator operator of the form node1 equal CompOp (node2, node3) (block 932), and the operator is one of the "equal to" or "not equal to" types, then node1 is implemented as a Boolean network of equalities over the respective segments (block 933).

If the node is a multiplexer operator of the form node1 equal MUX (selector, node2, node3) (block 934), then a list of multiplexers is produced of the form mux (selector, x,y), where each multiplexer takes a corresponding segmentation x, y of node2 and node3 (block 935). For example, assume that a 32-bit wide multiplexer node of the form $mux^{32}(n1^1, n2^{32}, n3^{32})$ has been segmented into an 8-bit wide segment and a 16-bit wide segment (0 ... 7), (8 ... 31), and that the result of reimplementing $n1^1$ was $[m1^1]$, and that the result of reimplementing $n2^{32}$ and $n3^{32}$ was $[m2^{24}, m3^8]$ and $[m4^{24}, m5^8]$, respectively. Then we return a 24 bit wide multiplexer and an 8-bit wide multiplexer as follows: $[mux^{24}(m1^1, m2^{24}, m4^{24}), mux^8(m1^1, m3^8, m5^8)]$.

Figure 13:
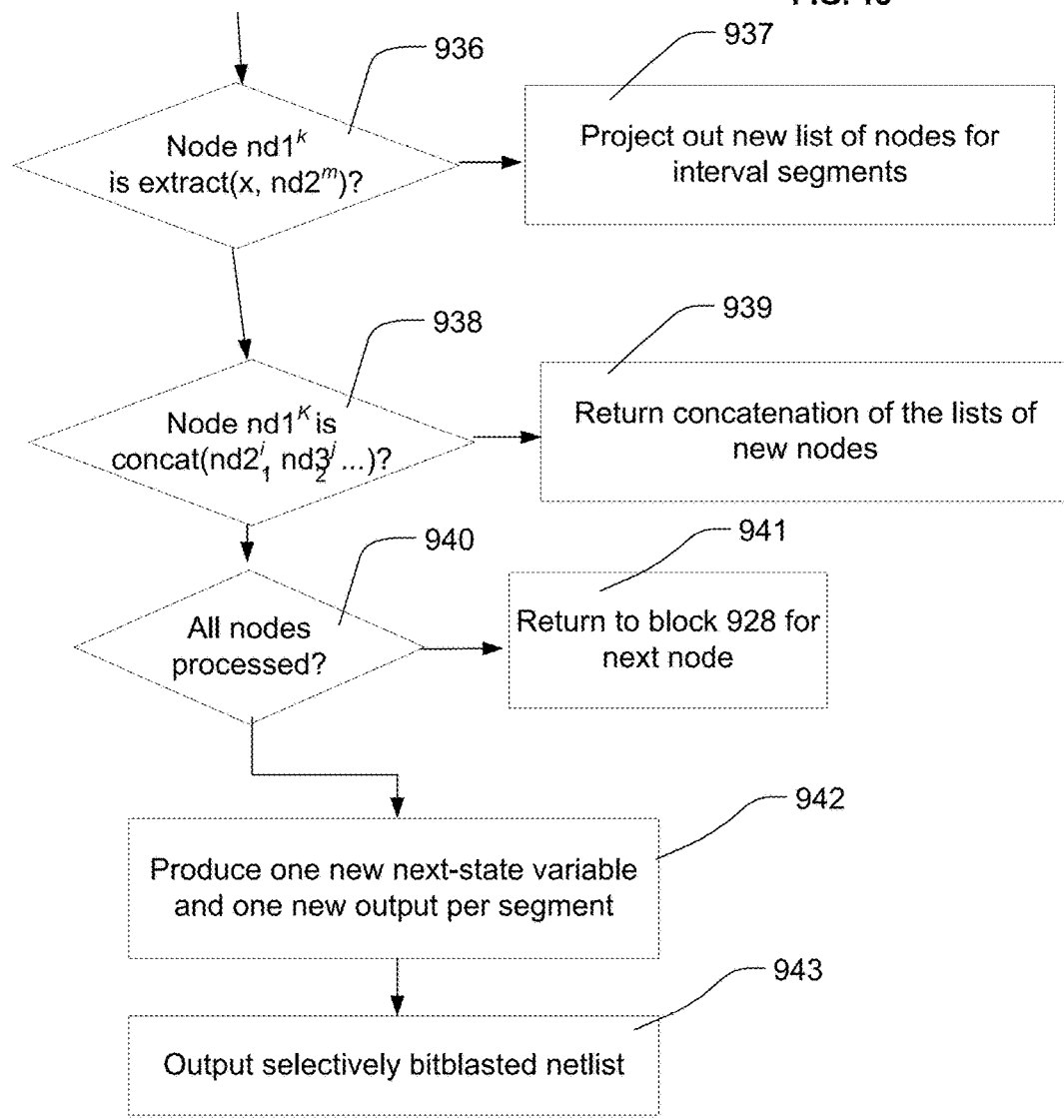
Figure 14:
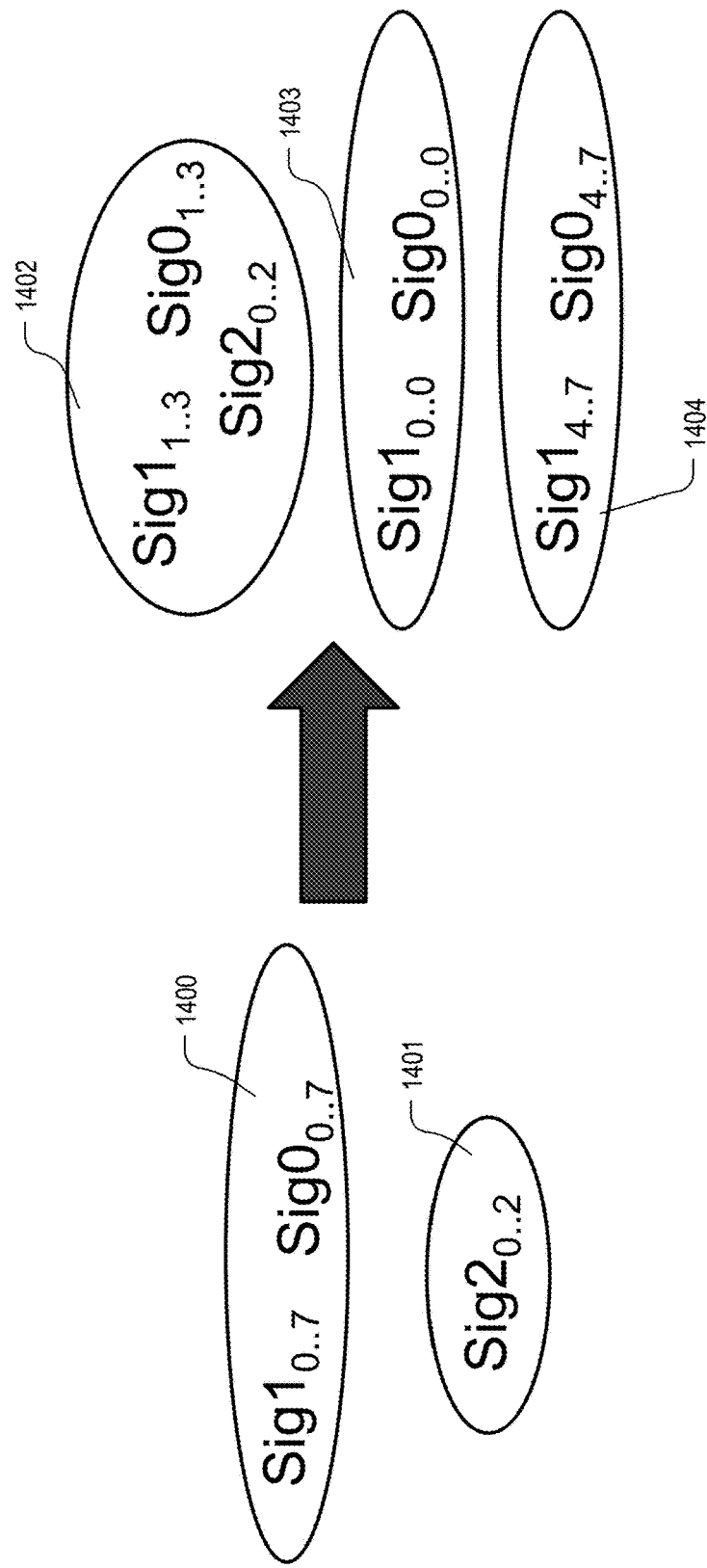
FIG. 14 illustrates an operation to process extraction nodes.

Proceeding to FIG. 13, if the node is an extraction operator of the form node1 equal extract(x, node2) (block 936), then a new list of nodes is generated for the segmentation of node2 (block 937). FIG. 14 illustrates an example of an extraction operation of the form $Sig2^3 = extract(x, Sig1)$, in which Sig1 is an 8-bit node that is a member of a dependency group 1400 with node Sig0. The extraction operator is a three bit wide operation producing a three bit wide node Sig2 1401, by extracting three bits starting at that location x in Sig1. Nodes Sig1 and Sig0 are split into a first set of three bit segments starting at that location x, which become members of dependency group 1402, with the output node Sig2, into single bit segments over bit location 0 which become members of dependency group 1403, and into a second set of three bit segments starting at bit location 4 which become members of the dependency group 1404.

If the node is a concatenation operator of the form node1 equal concat(node2, node3, ... ) (block 938), then a concatenation of the list of new nodes (i.e., nodes resulting from processing of (node2, node3, ... ) is generated for the operands (block 939).

Next, it is determined whether all the nodes in the data structure have been processed (block 940). If not, then the procedure returns to block 928 for a new node (block 941).

If they have all been processed, then in order to produce the final segmented data structure, a new next-state variable or output is provided at the top of the directed acyclic graph, at each of the new reduced nodes feeding the top of the graph (block 942). As a result of this processing, a selectively bitblasted netlist is produced (block 943). The selectively bitblasted netlist includes nodes operating on signals having a bit width of one, that is bit-level signals which get processed using standard Boolean logic. In addition, the selectively bitblasted netlist includes word-level nodes operating on signals having a bit width greater than one. The word-level signals are moved through the netlist in a multiplexer network, which generates bit-level signals using comparison operators. Also, an original input or state variable in the design may have been split into several parts, some of which are a bit-level and some of which are word-level.

In implementations of the technologies described above for particular netlists, constants are not shared among logic cones, because shared constants will force segmentation propagation from one cone to another unnecessarily. Thus, fresh variable nodes are introduced for each reference to a constant. At the end of the analysis, these introduced variable nodes are transformed back into constant nodes.

In addition, a circuit representation received from an HDL front end can be preprocessed to provide an improved starting point for the analysis. Specifically, the input netlists are swept to detect subgraphs where words are split up into bit-level signals, routed in a uniform way and recombined into word-level signals. These subgraphs are automatically re-implemented at the word-level.

In addition, symbolic memories represented as abstract read and write nodes can be processed as well. In this case, a write to memory, the segmentation of a value data transfers to all slots in the memory, and the value data becomes a member of the dependency class of all the slots in the memory. For a read, the segmentation from the memory will transfer to the output of the read node, and the dependency class of the output of the read node will include all the slots. In a write to an array with data having a particular segmentation, the segmentation is introduced to every memory location accessible by the write. In reads, the segmentation of the slots in the memory is applied to the read node.

A word-level model checking approach aimed at unbounded property checking for industrial netlists is described. The approach is based on a two-step method, where a quick analysis rewrites the netlist into a design where the word-level node segments that manipulate packages are completely separated from the rest of the logic. Then all packages are resized using statically computed safe lower bounds that guarantee preservation of the properties being checked. The resulting system can be analyzed using any standard bit-level model checking technique, or further processed using transformational verification simplifications.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for processing a computer implemented circuit representation of a circuit design, comprising:
   identifying subgraphs in the circuit representation, including words that are split up into bit-level signals, routed in a uniform way, and recombined into word-level signals, and
   re-implementing the identified subgraphs in the circuit representation at the word level to form subgraphs re-implemented at the word-level,
   modifying the circuit representation by replacing the identified subgraphs with the subgraphs re-implemented at the word level; and
   using the modified circuit representation as a starting point for computer implemented analysis of the circuit design.

2. The method of claim 1, wherein the analysis comprises a verification process for the circuit representation using the modified circuit representation.

3. The method of claim 1, wherein the circuit representation comprises a netlist.

4. The method of claim 1, wherein the circuit representation comprises a netlist; and
   the analysis comprises netlist reduction.

5. A data processing system adapted to process a computer implemented representation of a circuit design, comprising:

a data processor and memory coupled to the data processor, the memory storing instructions executable by the data processor to:

identify subgraphs in the circuit representation, including words that are split up into bit-level signals, routed in a uniform way, and recombined into word-level signals, re-implement the identified subgraphs in the circuit representation at the word level to form subgraphs re-implemented at the word level, modifying the circuit representation by replacing the identified subgraphs with the subgraphs re-implemented at the word level; and using the modified circuit representation as a starting point for computer implemented analysis of the circuit design.

6. The system of claim 5, wherein the analysis comprises a verification process for the circuit representation using the modified circuit representation.

7. The system of claim 5, wherein the circuit representation comprises a netlist.

8. The system of claim 5, wherein the circuit representation comprises a netlist, and the analysis comprises netlist reduction.

9. An article of manufacture providing software adapted to process a computer implemented representation of a circuit design, comprising:

a memory readable by a data processor, the memory storing instructions executable by a data processor to:

identify subgraphs in the circuit representation, each subgraph including words that are split up into bit-level signals, routed in a uniform way, and recombined into word-level signals, and re-implement the identified subgraphs in the circuit representation at the word level to form subgraphs re-implemented at the word level;

modifying the circuit representation by replacing the identified subgraphs with the subgraphs re-implemented at the word level; and using the modified circuit representation as a starting point for computer implemented analysis of the circuit design.

10. The article of claim 9, wherein the analysis comprises a verification process for the circuit representation using the modified circuit representation.

11. The article of claim 9, wherein the circuit representation comprises a netlist.

12. The article of claim 9, wherein the circuit representation comprises a netlist, and the analysis comprises netlist reduction.

* * * * *